United States Patent
Andreas

(10) Patent No.: US 10,593,559 B2
(45) Date of Patent: Mar. 17, 2020

(54) ETCHING PROCESS IN CAPACITOR PROCESS OF DRAM USING A LIQUID ETCHANT COMPOSITION

(71) Applicant: NANYA TECHNOLOGY CORPORATION, Taoyuan (TW)

(72) Inventor: Michael Tristan Andreas, Boise, ID (US)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/176,160

(22) Filed: Jun. 8, 2016

(65) Prior Publication Data

US 2016/0293448 A1 Oct. 6, 2016

Related U.S. Application Data

(62) Division of application No. 14/157,527, filed on Jan. 17, 2014, now abandoned.

(51) Int. Cl.
*H01L 21/3213* (2006.01)
*C09K 13/00* (2006.01)
*H01L 27/108* (2006.01)
*H01L 49/02* (2006.01)

(52) U.S. Cl.
CPC ........ *H01L 21/32134* (2013.01); *C09K 13/00* (2013.01); *H01L 27/10852* (2013.01); *H01L 28/90* (2013.01)

(58) Field of Classification Search
CPC .................... H01L 21/32134; C09K 13/00
See application file for complete search history.

(56) References Cited

U.S. PATENT DOCUMENTS

| | | | | |
|---|---|---|---|---|
| 5,956,594 | A * | 9/1999 | Yang ................ | H01L 21/76895 257/E21.011 |
| 2005/0208766 | A1* | 9/2005 | Kirby ................ | H01L 21/30608 438/667 |
| 2006/0016785 | A1* | 1/2006 | Egbe ...................... | G03F 7/425 216/83 |
| 2013/0029489 | A1* | 1/2013 | Suzuki ................. | B24B 37/044 438/693 |
| 2013/0203263 | A1* | 8/2013 | Shimada ........... | H01L 29/66545 438/753 |

(Continued)

FOREIGN PATENT DOCUMENTS

| | | |
|---|---|---|
| CN | 101090117 | 12/2007 |
| CN | 102031204 | 4/2011 |
| CN | 102568817 | 7/2012 |

OTHER PUBLICATIONS

WO2012121263, Sep. 13, 2012.*
"Office Action of China Counterpart Application," dated Feb. 15, 2017, p. 1-p. 8, in which the listed references were cited.

*Primary Examiner* — Thomas T Pham
(74) *Attorney, Agent, or Firm* — JCIPRNET

(57) ABSTRACT

An etching process in a capacitor process for DRAM is described. A substrate is provided, which has thereon a silicon layer and metal electrodes in the silicon layer. The silicon layer is removed using a liquid etchant composition. The liquid etchant composition contains tetramethylammonium hydroxide (TMAH), an additive including hydroxylamine or a metal corrosion inhibitor, and water as a solvent.

9 Claims, 2 Drawing Sheets

(56) References Cited

U.S. PATENT DOCUMENTS

| | | | |
|---|---|---|---|
| 2013/0241063 A1* | 9/2013 | Chiu | H01L 21/76877 257/751 |
| 2014/0001145 A1* | 1/2014 | Mizutani | H01L 21/02068 216/6 |
| 2014/0109931 A1* | 4/2014 | Lee | C11D 7/10 134/3 |

* cited by examiner

ETCHING PROCESS IN CAPACITOR PROCESS OF DRAM USING A LIQUID ETCHANT COMPOSITION

CROSS-REFERENCE TO RELATED APPLICATION

This application is a divisional application of and claims the priority benefit of U.S. application Ser. No. 14/157,527, filed on Jan. 17, 2014, now pending. The entirety of the above-mentioned patent application is hereby incorporated by reference herein and made a part of this specification.

BACKGROUND OF THE INVENTION

Field of Invention

This invention relates to integrated circuit fabrication, and particularly relates to a liquid etchant composition, and to an etching process in a capacitor process of DRAM (dynamic random access memory) using the liquid etchant composition.

Description of Related Art

A conventional DRAM cell includes a transistor and a capacitor coupled thereto. In a process for fabricating capacitors of DRAM, lower electrodes of the capacitors, which are made of TiN, are formed in trenches and/or holes previously formed in a poly-Si layer, an aqueous solution of tetramethylammonium hydroxide (TMAH) is used as an etchant to wet-etch and remove the poly-Si layer, and then a capacitor dielectric layer and an upper electrode are formed covering the surfaces of the lower electrodes.

In the above process, a limited etching selectivity of poly-Si to TiN may limit the capacitor height, destroy the structures of the TiN electrodes, or leave behind silicon residuals to cause electrical shorts between the memory cells.

SUMMARY OF THE INVENTION

In view of the foregoing, this invention provides a liquid etchant composition that has a higher etching selectivity of silicon to TiN.

This invention also provides an etching process in a capacitor process of DRAM, which uses the liquid etchant composition to remove the silicon layer containing the lower electrodes.

The liquid etchant composition of this invention includes TMAH, an additive including hydroxylamine (HDA) or a metal corrosion inhibitor, and water as a solvent.

The etching process in a capacitor process of DRAM of this invention is described as follows. A substrate is provided, which has thereon a silicon layer and a plurality of metal electrodes in the silicon layer. The silicon layer is removed using the liquid etchant composition of this invention.

Because hydroxylamine can selectivity increase the etching rate of Si, or the metal corrosion inhibitor can inhibit the corrosion of the metal material (e.g., TiN) of the metal electrodes, the etching selectivity of Si to the metal material can be much improved by using the liquid etchant composition of this invention. Hence, by applying the liquid etchant composition to the capacitor process of DRAM, the capacitor height can be increased, the structures of the metal electrodes are not easily destroyed, and silicon residual causing electrical short is not easily left behind.

In order to make the aforementioned and other objects, features and advantages of this invention comprehensible, a preferred embodiment accompanied with figures is described in detail below.

DESCRIPTION OF EMBODIMENTS

This invention is further explained with the following embodiments referring to the accompanying drawings, which are not intended to limit the scope of this invention.

Figure 1:
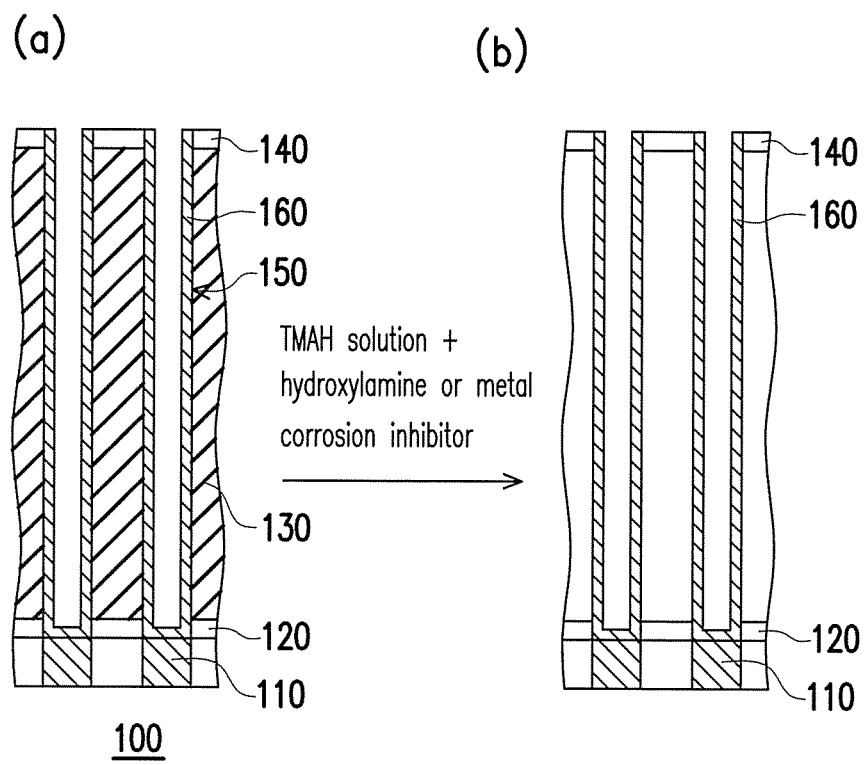
FIG. 1 illustrates, in a cross-sectional view, a capacitor process of DRAM according to an embodiment of this invention.

FIG. 1 illustrates, in a cross-sectional view, a capacitor process of DRAM according to an embodiment of this invention.

Referring to FIG. 1(a), a substrate 100 is provided, on which a plurality of metal contacts 110, an etching stop layer 120, a silicon layer 130, a cap layer 140 have been formed, a plurality of trenches 150 have been formed in the cap layer 140, the silicon layer 130 and the etching stop layer 120, and a plurality of metal electrodes 160 as the lower electrodes of the capacitors are formed in the trenches 150. The metal contacts 110 may include TiN, Ru or TaN. The etching stop layer 120 may include silicon nitride (SiN) or silicon oxide. The silicon layer 130 may include poly-Si. The cap layer 140 may include SiN. The metal electrodes 160 may include TiN, Ru or TaN.

Referring to FIG. 1(a)/(b), a liquid etchant composition is used to wet-etch and remove the silicon layer 130 to expose the outer surfaces of the metal electrodes 160. The liquid etchant composition contains tetramethylammonium hydroxide (TMAH), an additive including hydroxylamine or a metal corrosion inhibitor, and water as a solvent.

The above wet etching is conducted suitably at a temperature of 70-80° C. The amount of TMAH relative to the total weight of the etchant liquid composition is suitably within the range of 4.5-5.5 wt %, usually about 5 wt %. When the additive includes hydroxylamine, the amount of hydroxylamine relative to the total weight of the etchant liquid composition is suitably with the range of 0.3-0.7 wt %, and the wet etching is suitably conducted at a temperature within the range of 70-80° C. When the additive includes a metal corrosion inhibitor, the amount of the metal corrosion inhibitor relative to the total weight of the etchant liquid composition is suitably within the range of 1 to 5 wt %, depending on the species of the metal corrosion inhibitor, and the wet etching is suitably conducted at a temperature within the range of 70-80° C.

In addition, when the metal electrodes 160 include TiN, the metal corrosion inhibitor includes a TiN corrosion inhibitor, which may include at least one compound selected from the group consisting of diprotic carboxylic acids and phenolic compounds. Examples of the diprotic carboxylic acids include oxalic acid, malonic acid, and succinic acid, etc. Examples of the phenolic compounds include phenol, 4-nitrophenol, and 4-hydroxybenzoic acid, etc.

Subsequent steps include depositing a capacitor dielectric layer on the inner and outer surfaces of each lower electrode 160, and then depositing a top electrode over the dielectric layer. These are well known in the art and are not described in details herein.

Some examples and comparative example are provided below to demonstrate the effects of this invention, wherein the processes and the conditions in the examples are not intended to limit the scope of this invention.

Example 1

A wafer having thereon a TiN layer of about 10 nm, and another wafer having thereon a poly-Si layer of about 1000 nm were provided. A 1.0 wt % HF solution was used to treat the surface of the TiN layer for 60 seconds and to remove any $SiO_x$ on the surface of the poly-Si layer for 30 seconds, distill water was used to rinse both wafers for 30 seconds, and a 5 wt % TMAH solution (purchased from Moses Lake Industries) added with a given amount of hydroxylamine (purchased from Sigma Aldrich) was used to etch the TiN layer at 75° C. for 20 minutes and etch the poly-Si at 75° C. for 10 seconds.

The TMAH solutions having been used to etch the TiN layer and the poly-Si layer respectively were then analyzed by ICP-OES (inductively couple plasma optical emission spectrometry) for respective contents of titanium and silicon. The measured contents were used to derive the respective etching rates of TiN and poly-Si.

Figure 2:
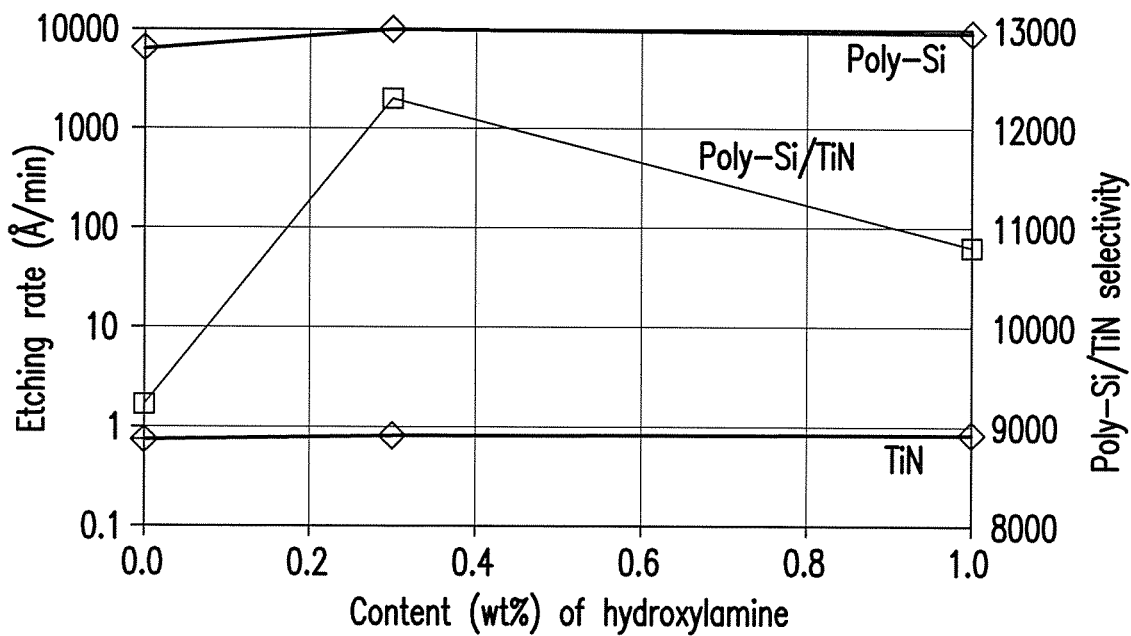
FIG. 2 shows variations of the respective etching rates of poly-Si and TiN (diamond points, left y-axis) and the poly-Si/TiN etching selectivity (square points, right y-axis) with the concentration of hydroxylamine in the TMAH-based liquid etchant in Example 1 of this invention.

FIG. 2 shows variations of the respective etching rates of poly-Si and TiN (diamond points, left y-axis) and the poly-Si/TiN etching selectivity (square points, right y-axis) with the concentration of hydroxylamine in the TMAH-based liquid etchant in Example 1 of this invention. The data of the etching rate is also listed in Table 1.

TABLE 1

| Content of hydroxylamine | Etching rate of poly-Si | Etching rate of TiN | Poly-Si/TiN selectivity |
|---|---|---|---|
| 0 wt % (TMAH control) | 6910 Å/min | 0.74 Å/min | 9280 |
| 0.3 wt % | 9930 Å/min | 0.81 Å/min | 12300 |
| 1.0 wt % | 8921 Å/min | 0.828 Å/min | 10800 |

It is clear from FIG. 2 and Table 1 that the etching rate of poly-Si increased with the content of hydroxylamine while that of TiN did not change much with the content of hydroxylamine. Accordingly, the etching selectivity of poly-Si to TiN can be improved by using the liquid etchant composition of this example, as shown in FIG. 2.

Example 2

A wafer having thereon a TiN layer of about 10 nm, and another wafer having thereon a poly-Si layer of about 1000 nm were provided. After a 0.5 wt % HF solution was used to treat the surface of the TiN layer and to remove any $SiO_x$ on the surface of the poly-Si layer for 2 minutes, a 5 wt % TMAH solution added with a given amount of a TiN corrosion inhibitor, which was provided by Tokyo Ohka Kogyo Co., Ltd. (TOK) and called ST-B046, was used to etch the TiN layer and the poly-Si layer at 75° C. or 80° C. for 6 minutes. A 0.5 wt % HF solution was then used to remove any $TiO_x$ on the surface of the TiN layer and to treat the surface of the poly-Si layer for 1 minute. The thickness of the remaining TiN layer was measured by the ellipsometry technique to derive the loss of the TiN thickness. The thickness of the remaining poly-Si layer was measured with X-section SEM to derive the loss of the poly-Si thickness.

The results are listed in the following Table 2:

TABLE 2

| | | Chemical | | | | |
|---|---|---|---|---|---|---|
| No. | TMAH | Additive (TiN corrosion inhibitor) | Temperature (° C.) | TiN etching rate (Å/min) | Poly-Si etching rate (Å/min) | Poly-Si/TiN selectivity |
| 1 | 5.0 wt % | 0 | 75 | 0.8 | 4760 | 5950 |
| 2 | 5.0 wt % | 0 | 80 | 1.1 | 6200 | 5900 |
| 3 | 5.0 wt % | 2.5a | 75 | 0.25 | 5660 | 22600 |
| 4 | 5.0 wt % | 5.0a | 75 | 0.15 | 4320 | 28800 |
| 5 | 5.0 wt % | 5.0a | 80 | 0.26 | 5720 | 22000 |

Figure 3:
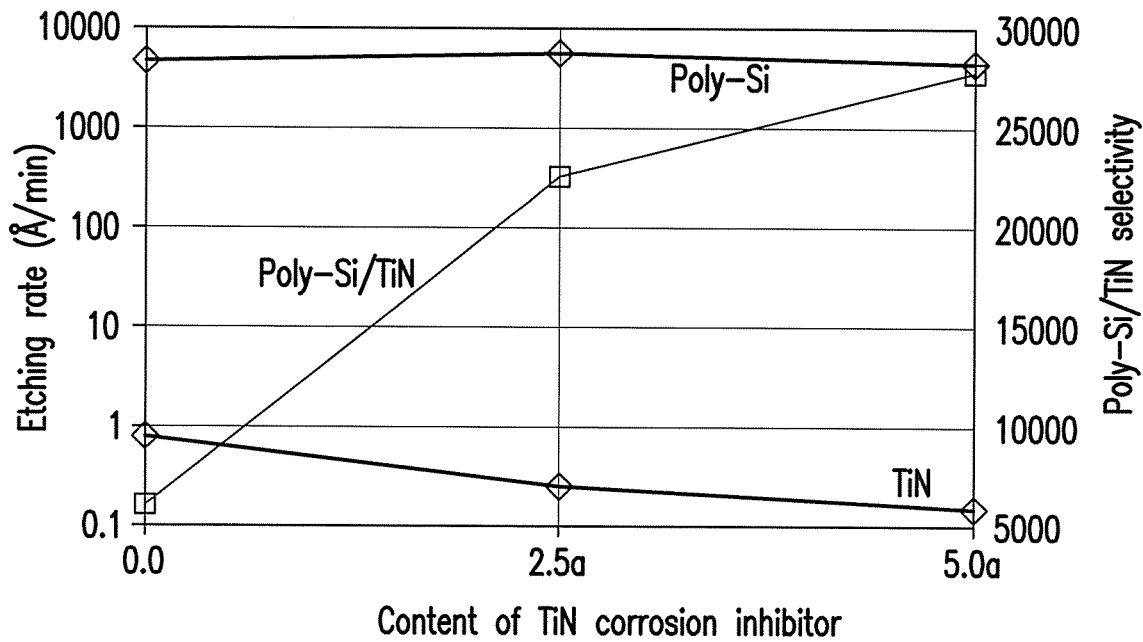
FIG. 3 shows variations of the respective etching rates of poly-Si and TiN (diamond points, left y-axis) and the poly-Si/TiN etching selectivity (square points, right y-axis) with the concentration of the TiN corrosion inhibitor in the TMAH-based liquid etchant at 75° C. in Example 2 of this invention.

Variations of the respective etching rates of poly-Si and TiN (diamond points, left y-axis) and the poly-Si/TiN etching selectivity (square points, right y-axis) with the concentration of the TiN corrosion inhibitor in the TMAH-based liquid etchant at 75° C. in Example 2 is shown in FIG. 3. It is clear that by using the TiN corrosion inhibitor, the TiN loss was reduced by about 50% while the poly-Si loss was reduced by merely about 5%. Accordingly, the etching selectivity of poly-Si to TiN can be remarkably improved by using the liquid etchant composition of this example, as shown in FIG. 3, wherein the data points were from the experiments conducted at 75° C.

Comparative Example 1

A wafer having thereon a TiN layer of about 10 nm, and another wafer having thereon a poly-Si layer of about 1000 nm were provided. A 1.0 wt % HF solution was used to treat the surface of the TiN layer and to remove any $SiO_x$ on the surface of the poly-Si layer for 60 seconds, distill water was used to rinse both wafers for 30 seconds, and a 5 wt % TMAH solution (produced by Moses Lake) containing a given amount of silicic acid (produced by Sigma-Aldrich) was used to etch the TiN layer and the poly-Si layer at 75° C. for 20 minutes.

The TMAH solutions having been used to etch the TiN layer was then analyzed by ICP-OES for the content of titanium. The measured content was used to derive the etching rate of TiN. The thickness loss of the poly-Si layer was not measured, because previous experience with silica loading in TMAH suggested no change to Poly-Si etching rate within this range of silicic acid addition.

The results are listed in the following Table 3:

TABLE 3

| Content of silicic acid | Etching rate of poly-Si | Etching rate of TiN | Poly-Si/TiN selectivity |
|---|---|---|---|
| 0.0 wt % (TMAH control) | 6910 Å/min | 0.491 Å/min | 14100 |
| 0.1 wt % | 6910 Å/min | 1.42 Å/min | 4870 |

TABLE 3-continued

| Content of silicic acid | Etching rate of poly-Si | Etching rate of TiN | Poly-Si/TiN selectivity |
|---|---|---|---|
| 0.3 wt % | 6910 Å/min | 3.11 Å/min | 2220 |
| 1.0 wt % | 6910 Å/min | 6.81 Å/min | 1010 |

Figure 4:
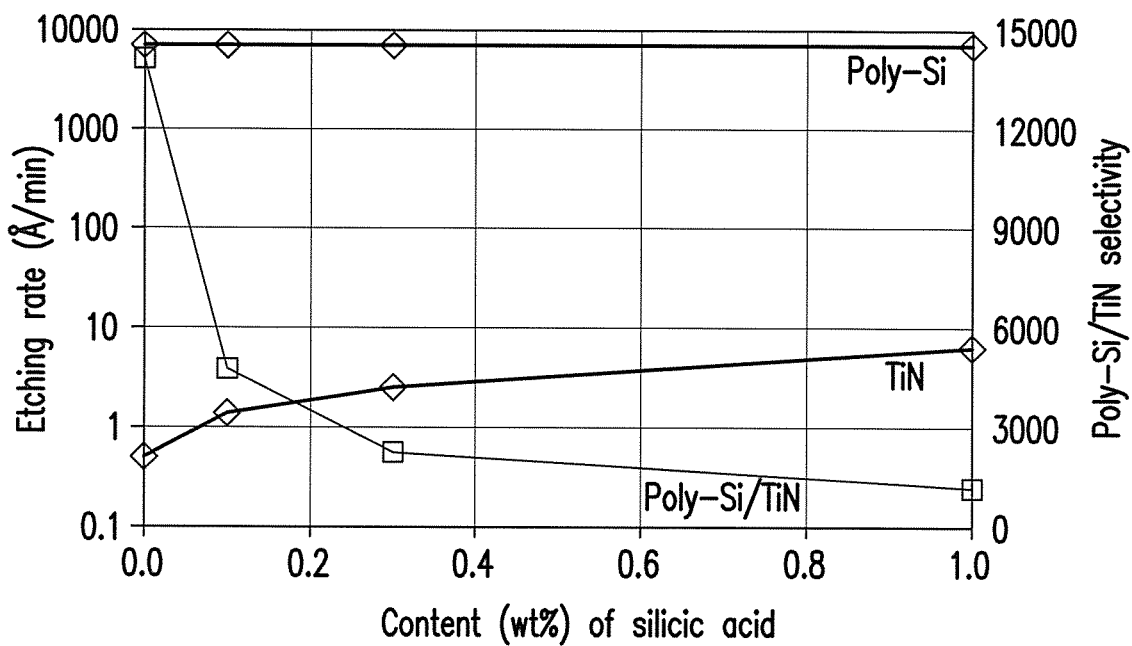
FIG. 4 shows variations of the respective etching rates of poly-Si and TiN (diamond points, left y-axis) and the poly-Si/TiN etching selectivity (square points, right y-axis) with the concentration of silicic acid in the TMAH-based liquid etchant in Comparative Example 1.

FIG. 4 shows variations of the respective etching rates of poly-Si and TiN (diamond points, left y-axis) and the poly-Si/TiN etching selectivity (square points, right y-axis) with the concentration of silicic acid in Comparative Example 1. It is clear from FIG. 4 that by using silicic acid, the etching rate of TiN was increased significantly. Since the etching rate of poly-Si is almost unchanged, the etching selectivity of poly-Si to TiN is significantly lowered by using the liquid etchant composition of this comparative example, as shown in FIG. 4.

Accordingly, the etching selectivity of Si to TiN can be remarkably improved by using the liquid etchant composition of the above embodiment. Hence, by applying the liquid etchant composition to the capacitor process of DRAM, the capacitor height can be increased, the container structures are not easily destroyed, and silicon residual causing electrical short is not easily left behind.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. An etching process in a capacitor process of DRAM, comprising:
providing a substrate that has thereon a silicon layer, a plurality of metal electrodes in the silicon layer, and a cap layer on the silicon layer, wherein the plurality of metal electrodes have outer surfaces, and the outer surfaces are located between the silicon layer and the plurality of metal electrodes;
removing the silicon layer to form trenches by using a liquid etchant composition, wherein each of the trenches is located between two adjacent metal electrodes and below the cap layer, and the trenches expose the outer surfaces of the plurality of metal electrodes; and
forming a dielectric layer on the outer surfaces of each metal electrodes,
wherein the liquid etchant composition comprising:
a main etchant consisting of tetramethylammonium hydroxide (TMAH), consisting of $NH_4OH$, or consisting of TMAH and $NH_4OH$;
an additive comprising a metal corrosion inhibitor; and
water as a solvent,
wherein the metal corrosion inhibitor comprises at least one compound selected from the group consisting of diprotic carboxylic acids and phenolic compounds, wherein the phenolic compounds comprise 4-nitrophenol and 4-hydroxybenzoic acid, and the diprotic carboxylic acids comprise malonic acid and succinic acid.

2. The etching process of claim 1, wherein the main etchant consists of TMAH, and the etching process is conducted at a temperature within a range of 65-85° C.

3. The etching process of claim 1, wherein the main etchant consists of $NH_4OH$, and the etching process is conducted at a temperature within a range of 50-70° C.

4. The etching process of claim 1, wherein the additive comprises the metal corrosion inhibitor in an amount within a range of 1 to 5 wt % relative to a total weight of the liquid etchant composition.

5. The etching process of claim 4, wherein the main etchant consists of TMAH, and the etching process is conducted at a temperature within a range of 65-85° C.

6. The etching process of claim 4, wherein the main etchant consists of $NH_4OH$, and the etching process is conducted at a temperature within a range of 50-70° C.

7. The etching process of claim 1, wherein an amount of TMAH is within a range of 4.5-5.5 wt % relative to a total weight of the liquid etchant composition.

8. The etching process of claim 1, wherein the metal electrodes comprise TiN, and the metal corrosion inhibitor comprises a TiN corrosion inhibitor.

9. The etching process of claim 1, wherein the silicon layer comprises poly-Si.

* * * * *